United States Patent [19]
Igel et al.

[11] Patent Number: 6,127,274
[45] Date of Patent: Oct. 3, 2000

[54] PROCESS FOR PRODUCING ELECTRONIC DEVICES

[75] Inventors: Guenter Igel, Teningen; Martin Mall, Freiburg, both of Germany

[73] Assignee: Micronas Intermetall GmbH, Freiburg, Germany

[21] Appl. No.: 09/030,480

[22] Filed: Feb. 25, 1998

[30] Foreign Application Priority Data

Feb. 27, 1997 [DE] Germany ............................ 197 07 887

[51] Int. Cl.$^7$ ................................................. H01L 21/301
[52] U.S. Cl. ........................ 438/710; 438/712; 438/718; 438/719
[58] Field of Search ................................. 438/689, 690, 438/691, 694, 699, 706, 702, 460, 462, 464

[56] References Cited

U.S. PATENT DOCUMENTS

| | | | |
|---|---|---|---|
| 3,639,811 | 2/1972 | Schroeder | 317/234 |
| 4,661,375 | 4/1987 | Thomas | 427/89 |
| 5,110,764 | 5/1992 | Ogino | 437/224 |
| 5,789,307 | 8/1998 | Igel et al. | 438/464 |

FOREIGN PATENT DOCUMENTS

| | | | |
|---|---|---|---|
| 4317721 | 7/1994 | Germany | H01L 21/78 |
| 4020195 | 6/1995 | Germany | H01L 21/78 |

OTHER PUBLICATIONS

German Search Report, dated Mar. 13, 1997.

*Primary Examiner*—Benjamin L. Utech
*Assistant Examiner*—Lan Vinh
*Attorney, Agent, or Firm*—Arthur L. Plevy; Buchanan Ingersoll PC

[57] ABSTRACT

There is disclosed a process for producing electronic devices from a semiconductor wafer. The process comprises forming separation regions with a spatial pattern on the semiconductor wafer to provide separation between electronic devices, and depositing a conductive contact layer on the wafer and patterning the contact layer in such a way that conductive terminals extend from the front side of the wafer over at least part of the cross section of the patterned separation regions. The terminals are bared by removing material of the wafer in the semiconductor regions starting from the backside of the wafer, and the terminals of adjacent electronic devices are separated.

19 Claims, 4 Drawing Sheets

PROCESS FOR PRODUCING ELECTRONIC DEVICES

FIELD OF THE INVENTION

This invention relates to a process for producing electronic devices from a semiconductor wafer having active regions for the electronic devices on its front side and separation regions for separating the electronic devices, the separation regions being patterned near the front side of the semiconductor wafer.

BACKGROUND OF THE INVENTION

A number of methods exist in the prior art for producing electronic devices from a semiconductor wafer. For example in DE 40 20 195, there is disclosed a process wherein electronic devices having active regions are formed on a semiconductor wafer, and separation regions are provided between the electronic devices for separating the latter. By forming a saw line, the separation regions are patterned. The electronic devices also include a depression and are separated by sawing along the saw lines.

Such a process is also disclosed in DE 43 17 721. There, the separation regions between the electronic devices are patterned by etching. This process uses an SOI (silicon-on-insulator) substrate. The electronic devices are separated by etching away the insulator layer.

After the electronic devices have been separated from the semiconductor wafer, they must be brought into contact with external arrangements, such as lead frames and/or printed circuit boards. The necessary contact pads are located on the surface of the electronic devices. The electronic devices are connected to the external arrangement by bonding techniques or by a flip-chip technology. Both methods are complicated and costly and involve various disadvantages. For instance, high mechanical stresses are induced in the electronic devices. The electronic devices must have a minimum height in order to withstand the mechanical loads during the mounting or bonding operations. Separate bonding pads must be provided for making contact to the electronic devices. Only a few materials are suitable for such pads. Further, flip-chip technology has the disadvantage that the electronic devices are not always suitable for use as sensors, since their surface is difficult to access for signal extraction. Problems are also encountered in processing the individual electronic devices after the separation step.

In U.S. Pat. No. 3,639,811 issued to Schroeder on Feb. 1, 1972, entitled "Semiconductor with Bonded Electrical Contact", a method for separation is disclosed wherein a sawing process is necessary for separating the side walls of the electronic elements. Thereafter, they are separated by mechanical pressure so that the terminals are separated from the adjacent electronic element. A disadvantage of this technique is that the terminals of the adjacent chips are out of line. Therefore, different types of chips are formed on the same wafer which leads to difficulties in the mounting process of the chips. Further, the combined sawing and pressure process is less precise and reliable than desired, since terminals can be easily damaged via the sawing process, requiring material to remain between elements.

Accordingly, it is highly desirable to obtain a process for producing electronic devices having conductive terminals via which the electronic devices can be better connected to external arrangements.

SUMMARY OF THE INVENTION

This object is attained by a process wherein a conductive contact layer is deposited and so patterned that conductive terminals extend from the front side of the semiconductor wafer over at least part of the cross section of the patterned separation regions, wherein the terminals are bared by removing material from the semiconductor wafer in the separation regions starting from the backside of the semiconductor wafer, and wherein the terminals of adjacent electronic devices are separated from each other. This process is advantageous in that the material is removed in the whole separation region, whereby the terminals are bared, and also in that the shape and length of the terminals are determined by the structure of the separation regions.

With the process according to the invention, electronic devices are fabricated with conductive terminals which extend from the front side along the side faces of the devices and have exposed ends. Via these terminals, the respective electronic device can be easily connected to an external arrangement. Since the terminals can be formed independently of the interconnection tracks on the electronic devices, their thickness can be chosen independently of the requirements placed on the interconnection tracks, so that a suitable thickness can be chosen for the contacting. Note that the terminals extend at most to the adjacent electronic element, which means that there is no overlap between the terminals and the adjacent electronic elements.

Simultaneously with the removal of the material in the separation regions, material can be removed from the backside of the semiconductor wafer. The terminals then protrude on the backside of the electronic device and may be of different designs. For example, they can be used as pins which provide support for the electronic device.

The removal of material of the semiconductor wafer is preferably done by etching. If the wafer is etched starting from the backside, the terminals can be exposed without being damaged. Depending on the structure of the separation regions, the backside of the wafer can be covered with a retardation layer which has a lower etch rate than the material of the wafer. In this retardation layer, openings are formed in those areas where the material of the wafer is to be removed at a greater rate. These are usually located in the separation regions. The thickness and the retardation rate of the retardation layer are chosen in accordance with the desired final thickness of the electronic devices, the thickness of the material to be removed in the separation regions, and the etch rate of this material.

In a further embodiment of the invention, the material of the semiconductor wafer is removed at a rate which has at least one gradient along the backside of the electronic devices, so that the backside of the electronic devices is inclined to their front side. This is particularly advantageous in sensor applications, since the sensor backside is usually parallel to a plane containing the mounting platform, so that the sensor surface can be inclined to the mounting platform.

The conductive contact layer may comprise electrically conductive, thermally conductive, or light-conductive material. Accordingly, the conductive terminals are used for an electric connection, for heat removal, or for the connection of an optical fiber or of a combination of different terminals. In the case of electric terminals, connections can be made by adhesive bonding, compression, soldering, or similar methods. Thus, no conventional bonding or flip-chip process is necessary. The electronic devices can be made very thin, since they are not exposed to any major mechanical loads during contacting. No separate terminals are necessary on the electronic devices, since the terminals extending on the front side can start from an area or a conductive track to be contacted. Further, there are no restrictions on the contact materials as are imposed by conventional contacting methods. In addition, no bonding wires have to be used. The cross section of the terminals and of the leads to the terminals can thus be chosen appropriately for the respective application without the latter being limited by the contacting method. The front side of the electronic devices is freely accessible, so that sensor pads can be applied there. The conductive contact layer may comprise different, successive layers.

The bared contact terminals can advantageously be treated by a thermal, chemical, or mechanical process. One example of a thermal treatment is laser cutting. With a laser beam, a one-piece contact associated with two adjacent electronic devices can be separated. It is also possible to heat the end of the terminal with a laser to form a drop-shaped terminal end, which is easier to contact. The bared terminals may be reinforced, particularly by electroplating. This increases the stability of the terminals, so that the latter can be subjected to greater stress. The bared terminals can then be treated, for example bent.

In a preferred embodiment of the invention, contact is made to the active regions through the conductive contact layer, with the contact layer being deposited on an insulator layer formed on the front side of the semiconductor wafer and having openings for contacting the active regions, and patterned. This is particularly advantageous in the case of an electrically conductive contact layer, because the conductive terminals extending outwardly from the electronic device can then be produced simultaneously with the deposition and patterning of the layer required to contact the active regions of the electronic devices. Adjacent terminals can be separated during the patterning of the contact layer.

Advantageously, the spatial pattern of the separation regions comprises a depression or elevation along the cross section. Forming an elevation along the cross section of the separation regions is advantageous if the terminals are to be elevated as seen from the surface of the electronic devices. In that case it is necessary to provide a retardation layer below the electronic devices in order to achieve a predetermined thickness of the electronic devices. The shape of the depression and the elevation can be chosen depending on the desired shape of the terminals and on their length. If a depression is formed in the separation regions, it may have at least one elevation. Conversely, a depression may be formed in an elevation. This makes it possible to produce terminals having a greater length. The conductive contact layer may be patterned such that a separation is provided in the patterned separation regions. Thus, the terminals associated with adjacent electronic devices are formed separately during patterning.

The maximum depth of the spatial pattern of the separation regions may be chosen in accordance with the desired final thickness of the electronic devices. The maximum thickness of the electronic devices is determined by the fact that during removal of the material, the conductive terminals are exposed. By providing suitably arranged retardation layers, the removal of material on the backside of the electronic devices and in the separation regions can be performed at different rates.

Adjacent electronic devices may be displaced in relation to one another in a horizontal plane of the semiconductor wafer, and the conductive terminals associated with an electronic device may extend along the entire cross section of the patterned separation region. In this manner, longer terminals can be produced without the need to form a broader or deeper or higher structure in the separation region.

If depressions were formed in the separation regions, they can be filled with a material different from that of the terminals, preferably with an insulator, and the front side can be provided with a layer of this material, so that the front side of the electronic devices is protected. In addition, the mutually isolated electronic devices are held together in the wafer array, so that further treatment of the electronic devices is possible while the devices are still on the wafer. The material can also be deposited on the backside of the wafer or of the electronic devices, so that the entire electronic device is surrounded by the material. This can serve to provide isolation and protection for the electronic devices. The backside is not provided with this material until the material of the wafer has been removed to the desired final thickness of the electronic devices. The material deposited on the front side and filled into the separation regions must not yet have been separated completely, so that the electronic devices of a wafer are held together. The deposition of material on the front side and the backside of the wafer can take place simultaneously. For this, use can be made of a mold which can be disposed in the depressions and in the separation regions in such a way that the regions will not be filled with the material. This prevents the terminals from being passivated.

Advantageously, the electronic devices held together by the material deposited on the front side and in the separation regions can be tested and marked while still on the wafer. The marks are applied to those electronic devices which are to be discarded.

BRIEF DESCRIPTION OF THE DRAWINGS

The invention will now be explained in more detail with reference to the accompanying drawings, in which:

FIG. 6b shows an enlarged detail from FIG. 6a; and

DETAILED DESCRIPTION OF THE INVENTION

Figure 1:
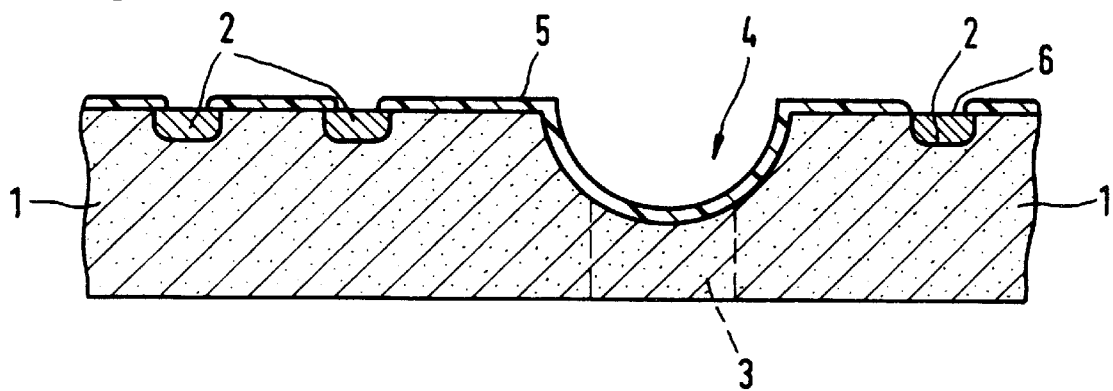
FIGS. 1 to 3 are cross sections of electronic devices after different steps of the process according to the invention.

FIG. 1 shows a part of a semiconductor wafer in a cross-sectional view. Portions of two electronic devices 1 to be produced from the wafer are shown. On the front side of the semiconductor wafer, active regions 2 for the electronic devices 1 are formed. Separation regions 3 are provided for separating the electronic devices 1. In the separation regions, a depression 4 is formed with respect to a plane through the front side of the semiconductor wafer. The front side of the semiconductor wafer is covered by an insulator layer 5 which has windows 6 for contacting the active regions 2. The insulator layer 5 is also provided in the depression 4 of the separation region 3. In this embodiment, the semiconductor wafer is a silicon wafer, and the insulator layer is made of silicon oxide or silicon nitride.

Figure 2:
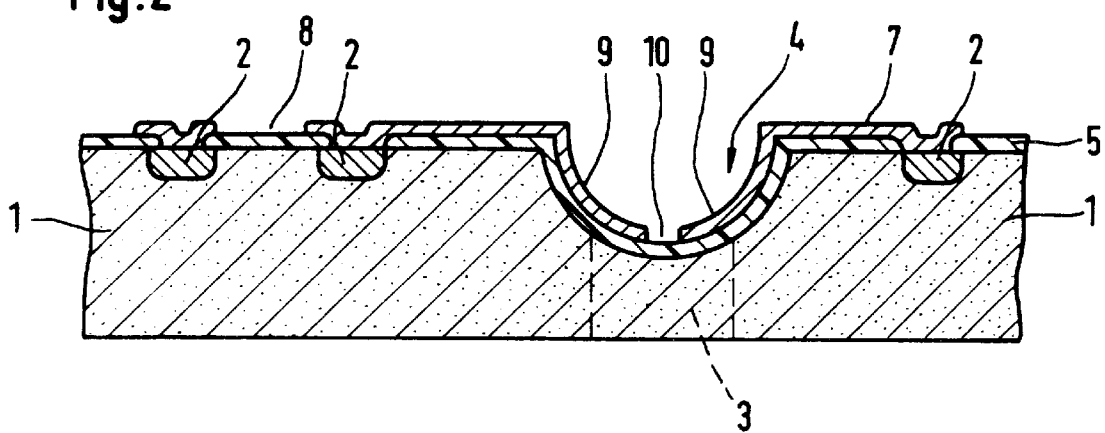

As shown in FIG. 2, an electrically conductive contact layer 7 is deposited on the front side of the semiconductor wafer of FIG. 1. The contact layer 7 is patterned in such a way that openings 8 are formed between active regions 2 not to be interconnected, and that terminals 9 are obtained which extend from the front side of the wafer along the cross section of the depression 4. In the lower area of the depression, a separation 10 is provided in the contact layer 7, so that the terminals 9 of the adjacent electronic devices 1 are electrically separated from each other. The contact layer 7 may consist of different, successive layers, and may include electrically conductive, thermally conductive, or light-conductive material.

Figure 3:
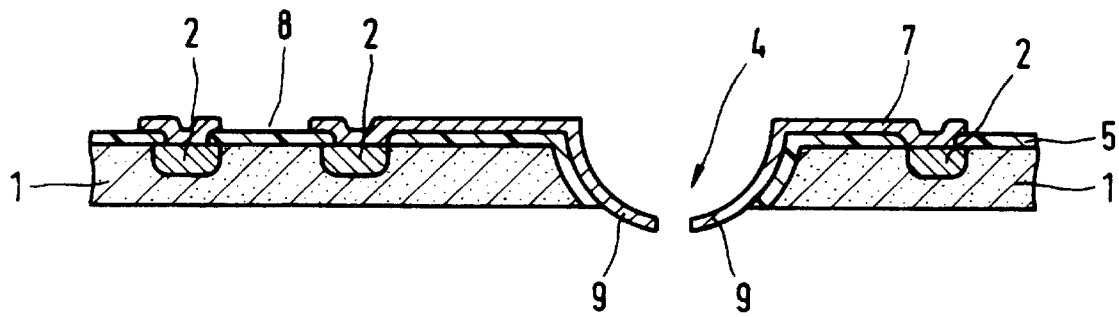

As shown in FIG. 3, material is removed from the backside of the semiconductor wafer of FIG. 2 to bare the terminals 9, with the terminals 9 of adjacent electronic devices 1 being separated from each other and the backside of the wafer or of the electronic devices 1 being thinned. After the thinning process, the now exposed layer 5 is removed in the separation region 3 in a separate etching step without the backside of the electronic devices 1 and the contact layer 7 being appreciably changed. The removal of the material of the semiconductor wafer is done by etching, so that the terminals 9 will not be damaged when being bared. The exposed terminals 9 can be treated by a thermal, chemical, or mechanical process. They can be reinforced by electroplating, for example.

The maximum depth of the depression 4 in the separation region 3 is chosen in accordance with the final thickness of the electronic devices 1 and the length of the terminals 9.

Figure 4:
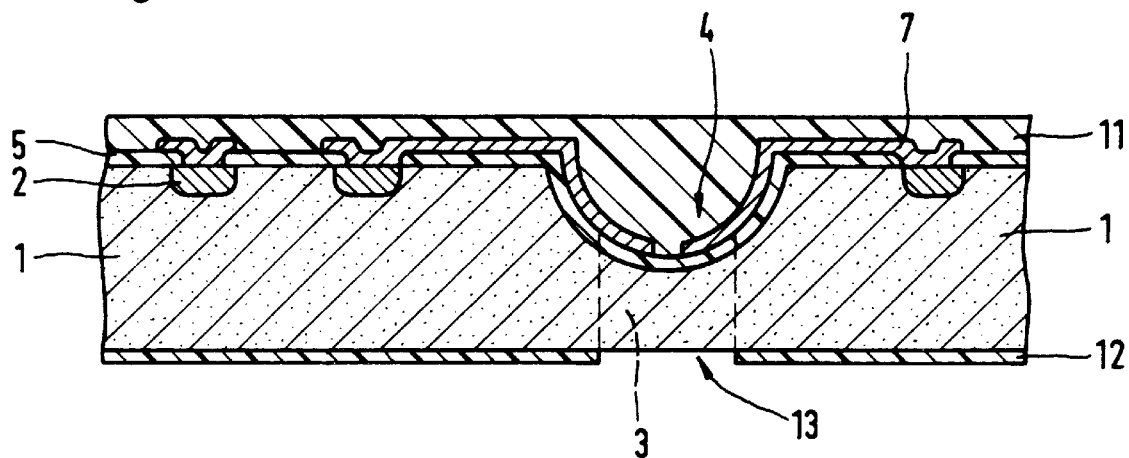
FIGS. 4 and 5 are cross sections of electronic devices fabricated according to another embodiment of the inventive process.

FIG. 4 shows an embodiment of the process according to the invention in which, starting from FIG. 2, the front side of the semiconductor wafer is covered by a layer 11 of a material which is different from the material of the contact layer 7, and, in the preferred embodiment, comprises an insulator. Layer 11 also covers and fills the depression 4. The backside of the wafer is covered by a retardation layer 12 which has an opening 13 in the separation region 3. As a result, the material in the area of the retardation layer 12 is removed at a slower rate than that in the separation region 3, so that a predetermined thickness of the electronic device 1 is maintained. After the layer 5 has been removed in the separation region 3, the electronic devices 1 are separated from each other through the separation 10.

Figure 5:
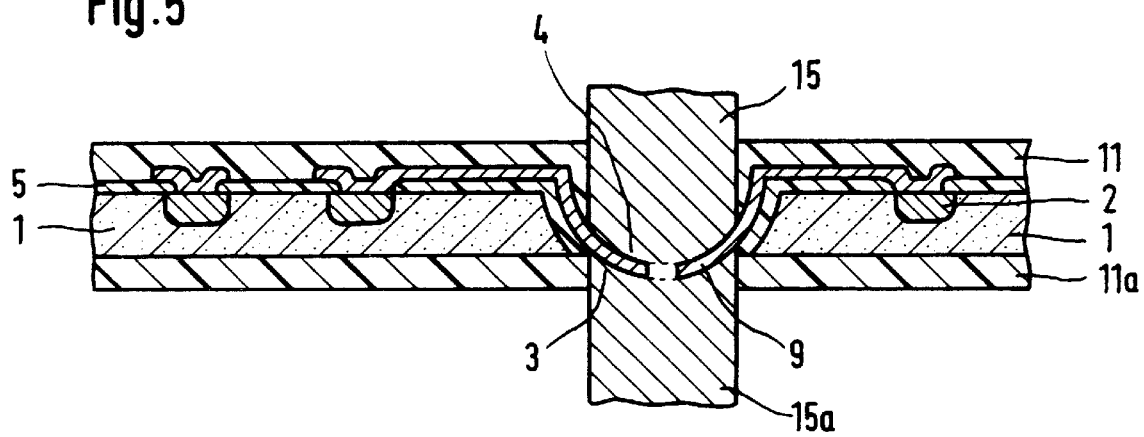

FIG. 5 shows electronic devices 1 in a wafer array. Their front side is covered by the layer 11, and their thinned backside is covered by a layer 11a made of the same material as the layer 11. Molds 15 and 15a are disposed in the separation region 3 and in the depression 4 between the electronic devices 1 which prevent the terminals 9 from being covered by the materials of the layers 11 and 11a. Corresponding molds are provided in the other depressions and separation regions between further electronic devices 1 of the semiconductor wafer.

Figure 6A:
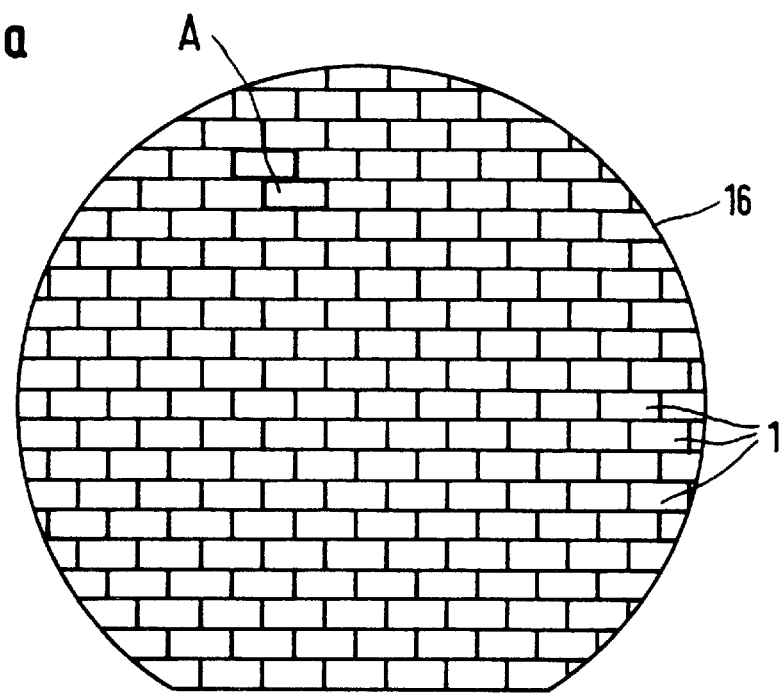
FIG. 6a is a top view of electronic devices in a semiconductor wafer.

FIG. 6a shows a top view of the wafer 16 in which the electronic devices 1 are interconnected. In this embodiment, the electronic devices are staggered with respect to each other in rows. Those sides of the electronic devices from which the terminals 9 project are displaced parallel to each other, such that the terminals 9 of facing devices do not lie opposite each other.

Figure 6B:
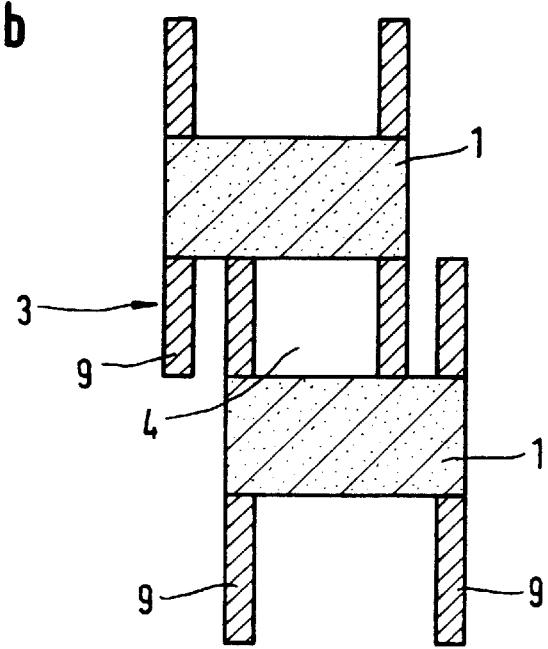

FIG. 6b shows an enlarged detail A of FIG. 6a. In this embodiment, the terminals 9 of an electronic device extend over the entire cross section of the depression 4 in the separation regions 3. No separation 10 is provided in the central area of the depression 4 between the terminals 9, but the terminals 9 extend over nearly the entire cross section of the depression 4. In this manner, considerably longer terminals 9 can be formed. The electronic devices 1 can be tested while they are still on the wafer shown in FIG. 6a.

Figure 7:
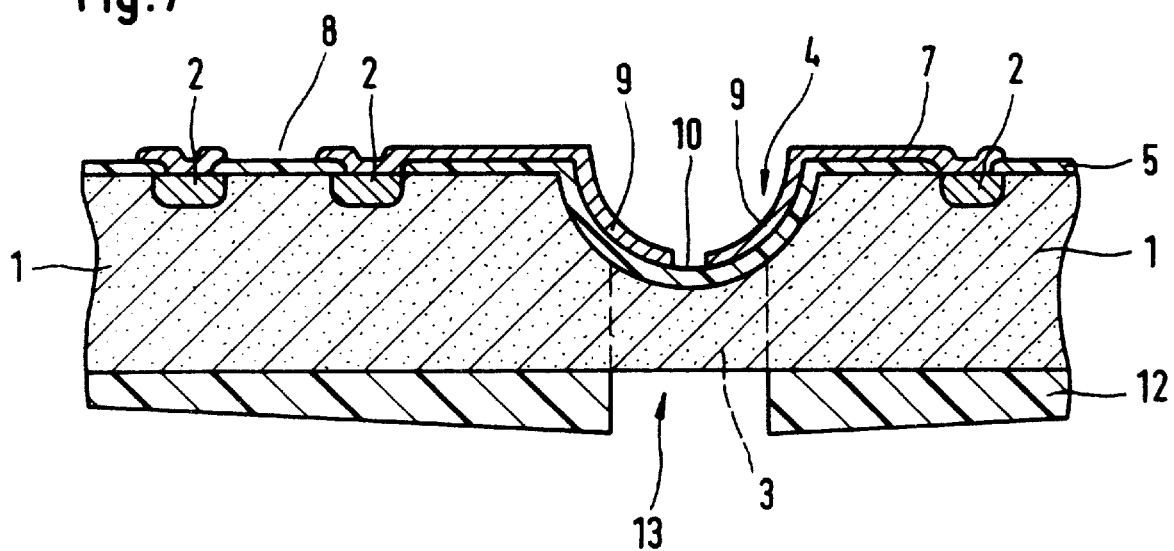
FIGS. 7 and 8 are cross sections of electronic devices fabricated according to a further embodiment of the inventive process.
Figure 8:
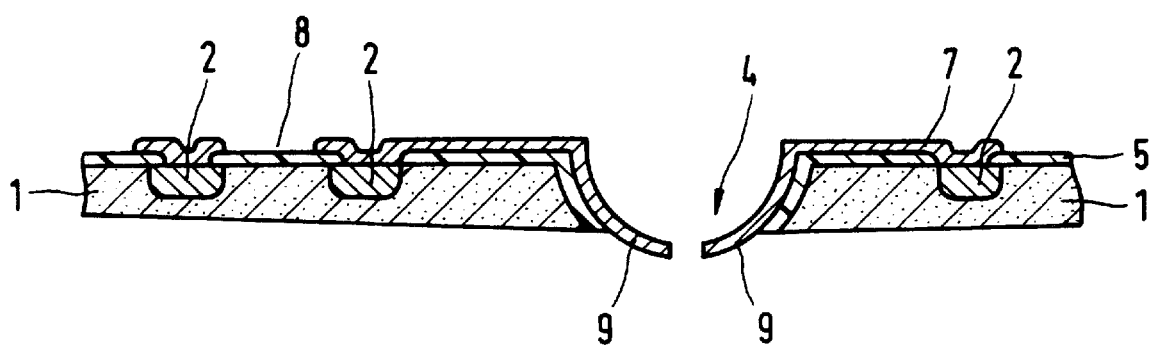

In the embodiment shown in FIG. 7, a retardation layer is deposited which is so constituted that the removal of the material of the semiconductor wafer takes place at a rate which exhibits a gradient along the wafer cross section or the cross section of the electronic devices 1. The gradient-like retardation of the removal of the wafer material results in electronic devices 1 whose backside is inclined to the front side. These electronic devices 1 are especially suited for use as sensor devices. They are mounted on a flat mounting plate with their backside, so that their front side is inclined to the plane of the mounting plate. From the same wafer, electronic devices 1 with different angles of inclination between the backside and the front side of the electronic devices 1 can be formed. Thus, sensors with differently inclined front sides can be mounted on a flat mounting plate. The sensor surface is on the front side; in the embodiment shown, it is formed by an active region 2. If contact is made to the sensor devices with the terminals 9 on a mounting base, the front side of the sensor devices, and thus the sensor surface, is easily accessible for signal extraction.

It should be understood that a person skilled in the art may make many variations and modifications to the embodiments described herein utilizing functionally equivalent elements to those described. Any and all such variations or modifications as well as others which may become apparent to those skilled in the art, are intended to be included within the scope of the invention as defined by the appended claims.

What is claimed is:

1. A process for producing electronic devices from a semiconductor wafer having active region for the electronic devices on a front side and separation regions for separating the electronic devices, the separation regions being patterned near the front side of the semiconductor wafer, comprising:

depositing a conductive contact layer on said semiconductor wafer and patterning said conductive layer to form conductive terminals extending from the front side of the semiconductor wafer over at least part of the cross section of the patterned separation regions, each said terminal extending at most to the adjacent electronic device such that no overlap exists between said terminal and said adjacent electronic device; and removing material from the semiconductor wafer in the separation regions starting from the backside of the semiconductor wafer to bare said terminals, wherein the step of removing said materials to bear said terminals separates adjacent electronic devices.

2. The process according to claim 1, wherein the step of removing material from the backside of the semiconductor wafer occurs simultaneously with the removal of the material in the separation regions.

3. The process according to claim 1, wherein the step of removing the material of the semiconductor wafer comprises etching.

4. The process according to claim 1, wherein the step of removing the material of the semiconductor wafer on the backside of the electronic devices is done with at least one gradient, so that the backside of the electronic devices is inclined to their front side.

5. The process according to claim 1, wherein the conductive contact layer comprises an electrically conductive, thermally conductive, or light-conductive material.

6. The process according to claim 5, wherein the conductive contact layer comprises different, successive layers.

7. The process according to claim 1, further comprising treating the bared terminals by a thermal, chemical, or mechanical process.

8. The process according to claim 1, further comprising reinforcing said bared terminals by electroplating.

9. The process according to claim 1, further comprising bending the bared terminals so as to extend essentially parallel to an associated side face of the electronic device.

10. The process according to claim 1, further comprising depositing an insulator layer between said contact layer and said semiconductor wafer, wherein contact is made to the active regions through the conductive contact layer, with the contact layer being deposited said insulator layer formed on the front side of the semiconductor wafer and having windows for contacting the active regions, said contact layer being patterned in such a way that a respective opening is formed between regions not to be interconnected.

11. The process according to claim 1, wherein the spatial pattern of the separation regions comprises a depression and/or an elevation along the cross section.

12. The process according to claim 11, wherein said depression has at least one elevation along the cross section.

13. The process according to claim 1, wherein the maximum depth of the spatial pattern of the separation regions dependent upon the thickness of the electronic devices.

14. The process according to claim 1, wherein adjacent electronic devices are displaced in relation to one another in a horizontal plane of the semiconductor wafer, and wherein the respective conductive terminals associated with an electronic device extend along the entire cross section of the patterned separation region.

15. The process according to claim 11, further comprising the step of depositing a layer of a material different from that of the terminals on the front side of the semiconductor wafer, and wherein said layer fills said depressions.

16. The process according to claim 15, wherein two layers of said material are simultaneously deposited on the front side outside the depressions and on the backside outside the separation region, respectively.

17. The process according to claim 15, wherein the coated electronic devices are tested on the wafer and marked according to the result of the test.

18. The process according to claim 15, wherein said layer of material comprises an insulator.

19. A method for forming electronic devices from a semiconductor wafer having a plurality of active regions formed on a front-side thereof, an oppositely disposed rear-side, and separation regions for separating the electronic devices, said method comprising the steps of:

depositing a conductive layer on said front-side of said semiconductor wafer;

patterning said conductive layer to form contact terminals each at least partially extending over one of said separation regions, each said terminal extending at most to an adjacent electronic device such that no overlap exists between said terminal and an adjacent electronic device; and removing material from the semiconductor wafer in the separation regions starting from the rear-side of the semiconductor wafer to simultaneously bare said terminals and separate adjacent electronic devices.

* * * * *